United States Patent [19]
Bohlen et al.

[11] 4,448,865
[45] May 15, 1984

[54] SHADOW PROJECTION MASK FOR ION IMPLANTATION AND ION BEAM LITHOGRAPHY

[75] Inventors: Harald Bohlen, Boeblingen; Johann Greschner, Pliezhausen; Peter Nehmiz, Stuttgart, all of Fed. Rep. of Germany

[73] Assignee: International Business Machines Corporation, Armonk, N.J.

[21] Appl. No.: 434,074

[22] Filed: Oct. 12, 1982

[30] Foreign Application Priority Data

Oct. 30, 1981 [DE] Fed. Rep. of Germany ..... 81109370

[51] Int. Cl.³ .............................................. G03F 9/00
[52] U.S. Cl. ..................................... 430/5; 430/313; 430/323; 156/643; 427/38
[58] Field of Search ................... 430/5, 323, 321, 322, 430/313; 156/643; 427/38; 428/137, 210

[56] References Cited

U.S. PATENT DOCUMENTS 3,971,684  7/1976  Muto .................................. 156/13

FOREIGN PATENT DOCUMENTS 2922416 12/1980 Fed. Rep. of Germany .......... 430/5
54-32143  3/1979 Japan .

OTHER PUBLICATIONS

Suzuki et al., Conference: Electrochemical Society, Incorporated, Spring Meeting, Montreal, Canada, May 9–14, 1982, pp. 518–519.
Furya et al., Fujitsu Sci. & Tech. J. (Japan) vol. 15 (4), Dec. 1979.

*Primary Examiner*—John E. Kittle
*Assistant Examiner*—José G. Dees
*Attorney, Agent, or Firm*—Sughrue, Mion, Zinn, Macpeak and Seas

[57] ABSTRACT

A projection mask comprises a thin P+-doped silicon layer with through holes adapted to the mask pattern, a grid supporting this layer having silicon ribs. On at least on its side facing away from the grid, the layer has a layer, which is at least as thick as to prevent the implanting of ions in the silicon layer. At least the mask surface exposed to ion irradiation is electrically and thermally conductive, and mechanically resistant. The coating of the silicon frame of the mask is such that it does not cause any mask deformation caused by temperature and/or through inherent tensions of the coating. Preferred absorbing materials are gold, silver, platinum, tungsten, and tantalum, and mechanically resistant materials are preferably carbon, molybdenum, titanium, tungsten, and tantalum. In operation, the mask with grid is placed onto the substrate to be irradiated, and subsequently blanket-illuminated with an ion beam, or scanned line-by-line until each point on the mask has been covered by the beam path.

13 Claims, 13 Drawing Figures

SHADOW PROJECTION MASK FOR ION IMPLANTATION AND ION BEAM LITHOGRAPHY

BACKGROUND OF THE INVENTION

1. Field of the Invention

The invention relates to a shadow projection mask for ion implantation and ion beam lithography. The mask utilizes a thin P-doped silicon layer with through holes adapted to the mask pattern together with a grid supporting the layer in regions without holes and being composed of silicon ribs doped differently from the silicon layer. The layer on the side facing away from the grid is covered with an ion-absorbing layer, and at least the surface exposed to ion radiation is electrically and thermally conductive.

2. Prior Art

Ion implantation is a well known technique that is widely used for doping semiconductor material. For selectively doping a semiconductor substrate, e.g. a silicon wafer, the generally applied method is to generate a mask on the semiconductor surface. Accordingly, on the surface, a layer of one material, e.g. a photoresist or a dielectric material, is applied and subsequently a pattern with through holes not covering the semiconductor regions to be doped is generated in the layer. The disadvantage of such masks is that they can only be used for the implantation process, and furthermore, they often have to be subsequently removed.

According to another known ion implantation method not requiring such masks, an ion beam whose diameter is smaller than the dimension of the smallest doped region to be made, moves over the semiconductor body in such a manner that at the end of the irradiation process each point on the semiconductor surface has been in the beam path. The ion beam during this process is blanked out under computer control in all those spots where the semiconductor material is not to be irradiated. With this method, doped semiconductor structures comprising very complex and minuscule structural elements can be made with satisfactory precision. The disadvantage of this method, however, is that it involves a very complex apparatus, and the attainable throughput will only suffice for series production if a very high ion current is used.

In European patent application No. 00 01 038, a silicon mask is described which can also be used for ion implantation. This mask is self-supporting and consists of a thin silicon layer with through-openings. A frame, also made of silicon but of lower doping then the silicon layer, supports the silicon layer in the regions without mask openings. This mask is placed onto the semiconductor substrate to be doped prior to ion implantation, or onto a $\leq 20$ μm thick spacer ring, respectively on the semiconductor substrate, and is removed again after ion implantation. The mask can thus be repeatedly used. Experience has shown, however, that after frequent use of the mask the thin silicon layer partially loses its mechanical stability, and consequently, the silicon mask irreversibly changes its shape. This is unacceptable if very small and closely packed doped regions are to be made with the mask.

With increasing microminiaturization in the semiconductor field, through which pattern elements to be transferred lithographically are getting progressively smaller, electron beam lithography will soon have reached its technical limits. Therefore lithography by means of ion beams, which compared with electron beams, exhibit some considerable advantages and is becoming more interesting. For example, unlike electron beams, ion beams have a negligible proximity effect. The advantages of ion beams, vis-a-vis electron beams, are discussed in R. L. Seliger and P. A. Sullivan, "Ion Beams Promise Practical Systems for Submicrometer Wafer Lithography", Electronics, Mar. 27, 1980, p. 142 et seq. This article also reveals that in ion lithography, similarly to ion implantation, the selectivity of application can be accomplished either through a deflectable focussed beam, or through the use of masks. The masks described therein consist of an ionabsorbing material placed onto a supporting film of monocrystalline silicon, or of aluminum oxide. Hence, with these masks, the ions used for irradiation have to penetrate a material before reaching the substrate to be irradiated.

German Offenlegungsschrift No. 29 22 416 describes masks which are preferably used in electron beam lithography, but also find application in ion beam lithography. In the regions which are not covered by the mask material, the masks described in the Offenlegungsschrift have throughgoing holes in the supporting film which consists of monocrystalline P+-doped silicon and suspended between the grid ribs. Through holes in the supporting layer are advantageous because ions which have to penetrate a layer, be it ever so thin, are necessarily scattered. While there is much less scattering than if electrons are used, but for transferring structures of $\leq 0.5$ μm even the use of a socalled "channelling layer" is no longer acceptable. A "channelling layer" is a monocrystal membrane through which with an optimum angle of bombardment the ions can penetrate with only a minimum scattering.

Originally it had been assumed that for ion beam and electron beam lithography basically the same masks can be used. As specified, however, by U. Behringer and R. Speidel during "Microcircuit Engineering 81" congress in Lausanne from Sept. 28 to 30, 1981, in a lecture entitled "Investigation of the Radiation Loads of a Self-Supporting Silicon Mask in an Ion Beam Proximity Printer", irradiation with ions can cause a reversible or irreversible modification of the mask. In their tests, Behringer and Speidel used three types of masks which all have a basic frame of a film with physical holes, which consisted of P+-doped monocrystalline silicone. The film was supported by a grid of silicon ribs. The masks of a first type were coated on both sides with gold, the masks of a second type were coated on both sides with aluminum, and the masks of a third type consisted only of the silicon frame.

The masks of the first type did not reveal to the authors any important changes (>0.2 μm). The masks of the second type became gradually non-planar through ion bombardment. However, the non-planarity could be eliminated again by means of a tempering for 15 minutes at 400° C. The masks of the third type were destroyed after a relatively short period of use, which in the opinion of the authors was due to the poor thermal conductivity of the mask. Although the results attained by the authors indicate that the masks of the first type are suitable for ion beam lithography, the inventors of the subject of the present application have found that when gold-coated ion beam masks are used there is contamination of the irradiated substrates with gold. This is unacceptable, particularly because of the strong effects of gold in semiconductor material.

SUMMARY OF THE INVENTION

It is therefore the object of the invention to provide a shadow projection mask for ion implantation and ion beam lithography, which in use is stable dimensionally.

It is another object of this invention to provide a shadow projection mask for ion implantation and ion beam lithography which does not cause any significant contamination of the irradiated substrates.

Yet another object of this invention is to provide a shadow projection mask for ion implantation and ion beam lithography which can be reproducibly made under conditions of commercial production.

These and other objects are achieved with a mask comprising a thin P+-doped silicon layer (1) with through holes adapted to the mask pattern. A grid (2) supports the layer (1) in areas without holes and comprises silicon ribs doped differently from the silicon layer (1) having on at least its side (in the following description called the "upper side") facing away from the grid (2) an ion-absorbing layer, where at least the surface exposed to ion radiation is electrically and thermally conductive. Where the layer is to be exposed to the ion beams the coating of the silicon frame (1, 2) of the mask is made at least of such a thickness, taking into consideration the ion energy and the characteristics of the covering material, that no ions penetrate into the silicon. The mask surface exposed to the ion radiation comprises a material resistant to the ion attack and the silicon frame (1, 2) coating is such that it does not cause mask deformation as a result of temperature and/or inherent tensions of the coating.

The mask of this invention represents a unique departure from the prior art. Experience has shown furthermore that it is difficult to implement these features of the mask simultaneously. In an attempt to use on the mask side exposed to ion irradiation, instead of a material which like gold has high absorption property but is not sufficiently ion-resistant, a material which is ion absorbing as well as mechanically resistant (tantalum has been found to be such a material), an unacceptable deformation of the mask was found. This deformation is due to mechanical tensions which either appeared during the deposition of the tantalum owing to inherent tensions in the tantalum layer, or which formed while the mask was heated during ion irradiation in the tantalum.

It was then attempted to keep the mechanical tensions at an acceptable level and the absorbing and mechanically resistant or ion-resistant layer, respectively, was made of a thickness such that only the overall thickness of the mask was sufficient for completely absorbing the ions. However, unlike the opinion of Behringer and Speidel (supra), it became evident that for protecting the thin P-doped silicon layer against the effects of ion irradiation, it is not enough to ensure a sufficient heat dissipation, but additionally, the P+-doped silicon layer loses its stability if exposed to ion irradiation. By using a two-layer cover exposed to ion irradiation, with a thin layer of a mechanically resistant material tending to form mechanical tensions such as molybdenum being applied on a lower layer adjacent to the silicon and made of a material that is absorbing but not of a high mechanical resistance such as gold, it was then attempted to prevent mechanical tensions simultaneously to ensure that the mask was ion-resistant, and ensure that the ions could not penetrate into the silicon. However, it was found that the problem of mechanical tension was encountered also in that combination of materials, apparently because of the appearance of a bimetal effect.

For this problem a solution was found granting the above-mentioned advantages achieved through the use of one single layer which is absorbing as well as mechanically resistant, or of a double layer of that type, without the disadvantage of mechanical tensions during operation. This problem is solved by providing on the side facing the substrate to be irradiated a coating which itself builds up mechanical tensions. The thickness and composition of this coating is adapted to the coating on the mask side exposed to the ion beams in such a manner that the mechanical tensions in both coatings compensate each other. An additional function of this coating on the mask side facing the substrate results in improving still further the dissipation of the heat generated in the mask.

In spite of the undisputable advantages of the additional coating on the lower side of the mask, there still remains the difficulty that it makes mask production more complex. Efforts were therefore made also to find a solution operating without the need for an additional coating.

Finally, an embodiment of the mask was found, where on that side of the silicon layer which faces the ion irradiation a gold layer is applied, and onto the gold layer a thin carbon layer is applied.

Carbon is highly resistant to ion beams (approximately 30 times more ion resistant than gold), and it is a known fact that a relatively thin carbon layer through which the ion irradiation passes practically without attenuation will reliably prevent the removal of gold. Furthermore, carbon is thermally and electrically conductive. Gold is known to be a very good ion absorber. Another important advantage of carbon/gold coating is that the use of the mask does not comprise any mechanical tensions in this specific coating. Gold, if it is thinner than 1 $\mu$m, as well as carbon individually do not tend to build up mechanical tensions. However, while the combination of gold and e.g. molybdenum generates a mechanical tension in view of the above-discussed bimetal effect, this is not so if a combination of gold with carbon is employed.

Further advantageous embodiments of the invention are specified with reference to the attached drawing and the description of the preferred embodiment that follows.

BRIEF DESCRIPTION OF THE DRAWING

The invention will be described with reference to embodiments specified by drawings. The drawings show the following.

DESCRIPTION OF THE PREFERRED EMBODIMENT

Figure 1A:
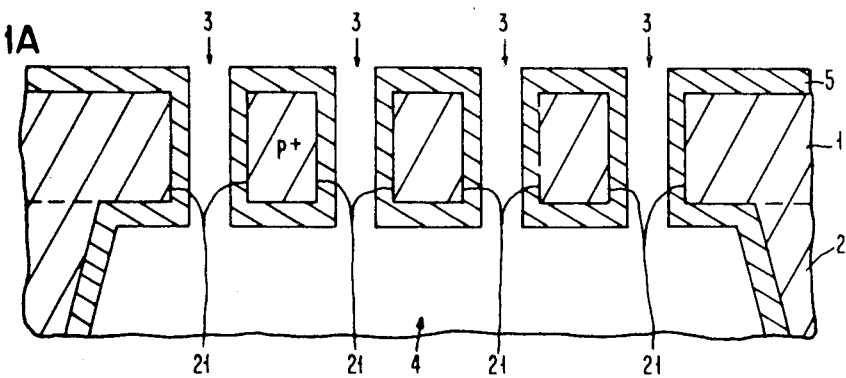
FIGS. 1A-1E are schematical cross-sections of five embodiments of the mask as disclosed by the invention.

FIG. 1 shows in a schematic cross-section a first embodiment of the mask of this invention. In FIG. 1, the silicon frame of the mask is covered on both sides with a layer of material having high absorption characteristics, as well as high mechanical resistance against ion beams. FIG. 1 depicts a section of a silicon wafer with a thin surface layer 1 which through its P+-doping differs from the other P- or N-doped material (substrate 2). Layer 1 has holes or windows 3, respectively, whose walls are substantially vertical to the surface of layer 1, and which define the mask pattern. Tub-like recesses 4 extend from the surface (not shown in FIG. 1) of substrate 2 which do not border on layer 1, into substrate 2 to such an extent that the windows 3 are opened toward tub 4. A silicon wafer can have a large number of tub-like recesses 4 which are separated from each other by a rib-shaped grid made of substrate 2. Each individual tub-like recess 4 is preferably associated with a defined mask sector in such a manner that all holes associated to this mask sector open into this tub-like recess 4.

Such a defined mask sector is, for example, the mask area associated to a chip on a semiconductor wafer, so that in this case the lateral dimensions of the tub-like recesses 4 are adapted to the chip size. Chip sizes of 6×6 mm are generally used today. If the silicon substrate used in the mask is a monocrystalline silicon wafer with a <100>-orientation, the walls of the tub-like recesses 4 are inclined at approximately 54°. If the silicon wafer is commercially available, the typical thickness is approximately 400 μm. The thickness of silicon substrates 2 in the mask structure can, however, be lower than the thickness of the silicon wafer which is assumed to be used in mask production. This must occur, for example, if the mask sectors associated to the individual tub-like recesses 4 are to be spaced at a distance which is shorter than that between the walls of two adjacent tub-like recesses 4 at their lowest point, which is formed with the above-mentioned angle of 54° and a substrate thickness of 400 μm. Surface layer 1 of the P+- type, preferably doped with boron, is between approximately 1-4 μm thick, and preferably between approximately 3-4 μm. The doping of the P+-doped layer decreases vertically to the substrate surface with increasing distance therefrom. The thickness of the P+-doped layer is defined as that distance from the substrate surface where the doping has decreased to a value of approximately $7 \times 10^{19}$ atoms/cm$^3$. The minimum width of holes 3 is less than 1 μm.

The above-described silicon structure represents the silicon frame common to all embodiments of the mask in accordance with this invention. The mask, i.e. more precisely surface layer 1 receives its stability substantially from its P+-doping, through substrate 2 designed as a grid of silicon ribs, and through the monocrystalline character of the frame. It is the purpose of the rib-shaped grid to increase the resistance of the mask between tub-shaped recesses 4 particularly against mechanical and also thermal stress, so that it can be handled e.g. in mask production without being damaged, if handled with suitable care. The rib-like net can supply this stabilizing effect because of its relatively high thickness. Although the individual silicon rib requires some space, the total space required by all silicon ribs, with reference to the overall surface of the mask is relatively small. This is because in the mask according to the invention the surface areas of the mask sectors between adjacent silicon ribs can be considerable. The thickness of silicon layer 1 is preferably between approximately 3-4 μm.

The masks in accordance with this invention can either be of the size of a conventional semiconductor wafer, as assumed above, and be divided by the silicon ribs between tub-like recesses 4 into mask sectors whose lateral dimensions are adapted to the size of a conventional semiconductor chip. Alternatively, the mask comprises only the surface defined by one or two tub-like recesses 4, i.e., it has only the lateral dimensions of 1 or 2 semiconductor chips.

In the mask of FIG. 1A, the silicon frame is enveloped with a tantalum layer which covers the surface exposed to ion irradiation, the walls of the holes, and the surface with the grid of silicon ribs. Tantalum is a mechanically resistant material which is of high resistance to ion irradiation. Owing to its metallic character, it exhibits high electric and thermal conductivity, and it furthermore has an ion absorption which is only slightly less than that of gold. The thickness of tantalum layer 5 on the mask side exposed to the ion irradiation (in the following called upper side), as a function of the ion energy applied in the range between approximately 50 and approximately 200 keV, is between approximately 0.3 and 0.8 μm.

Depending on the manner of application, the layer thickness at the hole walls is lower by a factor between approximately 1.5-3 than at the mask surface. The layer thickness on the mask surface with the grid of silicon ribs (in the following called lower side) is of approximately the same order of thickness as the layer on the upper side of the mask. However, since the tantalum layer on the lower side of the mask is employed to compensate the mechanical tensions produced by the layer on the mask upper side, and as these tensions also depend on the geometry of the mask, the necessary thickness of the layer on the lower side of the mask can only be precisely determined through experiments which, however, are quite uncomplicated.

Another function of the layer on the lower side of the mask, apart from compensating the tensions, is to dissipate the heat. Beside tantalum, layer 5 can also be made of tungsten which absorbs ions even better than tantalum (the tungsten layer on the upper side of the mask is preferably between approximately 0.2 and 0.6 μm thick). As in the embodiment described with reference to FIG. 1A, the layer on the upper side of the mask is preferably made of the same material as the layer on the lower side of the mask. It should, however, be pointed out that the layer on the lower side of the mask whose critical features are not a high ion absorption or high mechanic stability but, beside a tendency a build up mechanical tensions at most the thermal conductivity, may also comprise a material other than the layer material on the upper side of the mask.

Figure 1B:
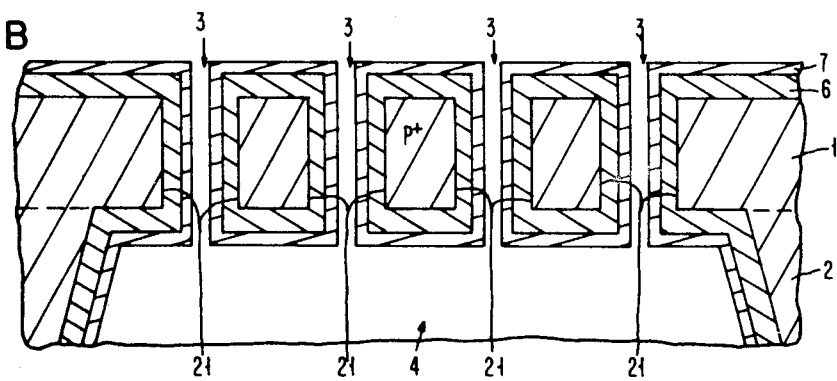

The embodiment of FIG. 1B of the mask as disclosed by the invention differs from the depicted in FIG. 1A in that the silicon frame is enveloped with two layers, that is, a lower gold layer 6 and an upper molybdenum layer 7. Molybdenum is highly resistant to an attack of ion beams, and it is thermally and electrically conductive. Also, its ion absorption is not very high. Gold on the other hand is not very resistant to ion irradiation, but its ion absorption is very high. Depending again on the ion energy, the layer thicknesses on the upper side of the mask are for gold between approximately 0.15-0.45 μm, and for molybdenum between 0.1-0.3 μm. In holes 3 of layer 1, the layer thicknesses, again depending on the manner of application, are smaller by a factor between approximately 1.5 and 3 than on the upper side of the mask. On the lower side of the mask, the layer thicknesses are of the same order as on the upper side of the mask. The coating on the lower side of the mask is necessary for compensating the bimetal effect observed in the molybdenum/gold layer structure, and is advantageous owing to its thermal conductivity.

Figure 1C:
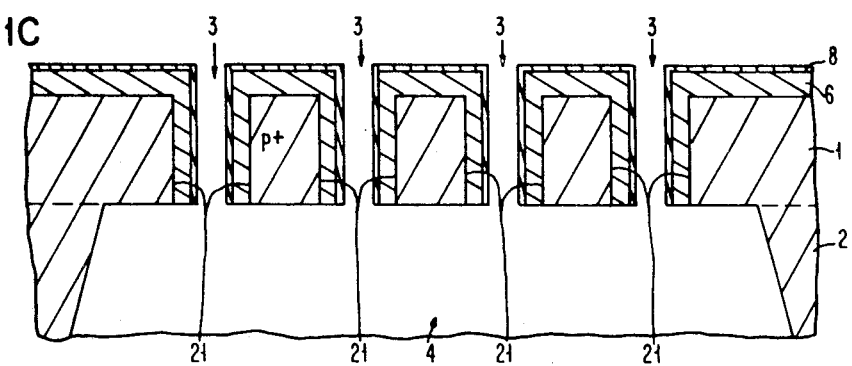

FIG. 1C shows another embodiment of the mask as disclosed by the invention, where only the upper side of layer 1 and the walls of the holes in this layer are coated. The coating comprises a lower layer 6 of gold, and an upper layer 8 of carbon. Although carbon permits the passing of ions without attenuation, i.e. has a very low absorption capacity, it is mechanically highly resistant (the ion etch resistivity of carbon is four to five times higher than that of tantalum). Furthermore, as specified above, a very thin carbon layer already can reliably prevent the removal of gold by means of ion beams. Depending on the ion beam energy used, the gold layer thickness on the upper side of the mask is between approximately 0.2–0.6 μm, and the thickness of carbon layer 8 is in the order of 0.1 μm. Depending again on the manner of application, the layers on the hole walls of layer 1 are thinner by a factor between approximately 1.5 and approximately 3 than the layers on the upper side of the mask.

The carbon has to cover the gold so completely that ions reaching gold layer 6 in any case have to penetrate carbon layer 8 first. As neither a gold layer of the above-mentioned thickness, nor the carbon cause any mechanical tension, and since there is no bimetal effect in the combination of the two materials the lower side of the mask does not require a coating.

It is nevertheless advantageous also to cover the lower side of the mask of FIG. 1C with a coating preferably of gold because this improves the ability of the mask to dissipate heat and additionally, consequently the temperature increase of the mask can be reduced even further. Such an embodiment of the mask as disclosed by the invention is shown in FIG. 1D where gold layer 6 extends also over the lower side of layer 1, and over the silicon ribs.

Figure 1D:
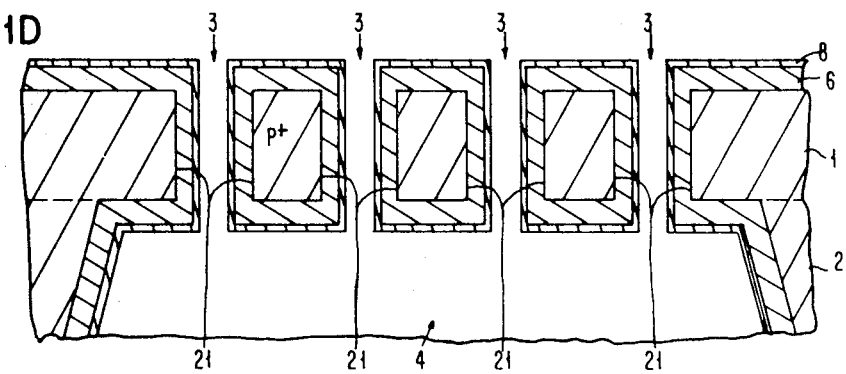
Figure 1E:
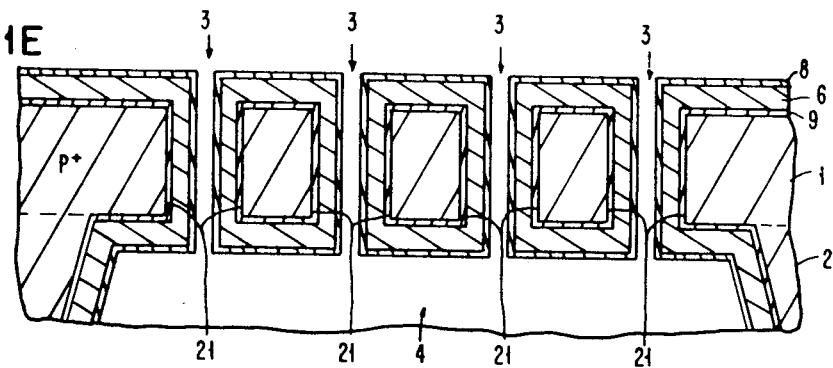

The mask of the embodiment shown in FIG. 1E differs from that of FIG. 1D in that between gold layer 6 and the silicon frame, a layer 9 preferably consisting of silicon nitride is provided. Layer 9 is between approximately 0.1 and approximately 0.2 μm thick. Its purpose is to prevent ions or atoms absorbed in gold layer 6, or also gold atoms, from diffusing into the P$^+$-doped silicon layer 1. The risk of such a diffusion exists particularly in those cases where the mask has been used over an extended period in ion implantation steps or in ion beam lithography steps. The atoms or ions, that through diffusion have penetrated into silicon layer 1, have a damaging effect on the stability of the silicon layer similar to that of ions directly implanted in the silicon layer. Such a diffusion barrier is recommended also for those cases where the absorber layer does not comprise gold but of some other material. If no layer material is found which could be used as a diffusion barrier against a specific type of ions, it is also possible to remove from a mask, after an extended period of time, the then highly "doped" coating, and subsequently to re-coat the silicon frame. In this manner, the most important part of the mask, i.e. the silicon frame, can be re-used.

In the following description, the production of the mask schematically represented in FIG. 1C will be described with reference to the processing steps shown in FIGS. 2A to 2H.

For a substrate 2, an N-doped, monocrystalline silicon wafer with <100>-orientation is used which typically is approximately 400 μm thick, but which can also be between approximately 100 and 400 μm thick. One substrate surface (in the following called lower side) is given a silicon dioxide layer 12 0.5 to 1 μm thick. For that purpose, substrate 2 is typically thermally oxidized in that for a predetermined period it is exposed at a temperature of approximately 1000° C. to an oxygen/steam atmosphere. After cooling the oxide layer grown on the surface (in the following called "upper side") facing away from the lower side is removed.

Subsequently, substrate 2 is highly doped from the upper side with an impurity producing P$^+$-conductivity. It is advantageous to use boron as an impurity. For doping, either ions of the impurity are implanted in a known manner, or the impurity is diffused into the substrate, the diffusion being effectuated at high temperatures either in an evacuated capsule, using boron-doped silicon for a diffusion source, or in an open tube, with a carrier gas flow preferably containing BBr$_3$ as a boron source flowing over the semiconductor wafers. During the doping the P$^+$-doped silicon layer 1 is formed where the doping, if doping takes place by means of diffusion, is highest on the surface, and whose doping decreases with the distance to the surface. The thickness is defined as that distance from the surface where the doping concentration is $7\times10^{19}$ impurity atoms/cm$^3$. The thus obtained structure is shown in a cross-section in FIG. 2A. Layer 1 can also be an epitaxial layer applied on substrate 2.

Figure 2A:
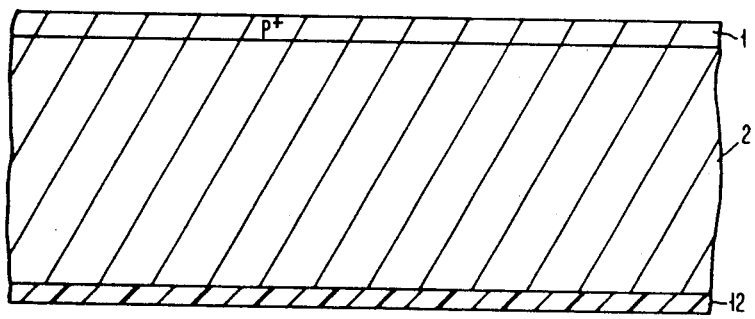
FIGS. 2A-2H are schematic cross-sections of the mask of FIG. 1C, in various stages of its production.
Figure 2B:
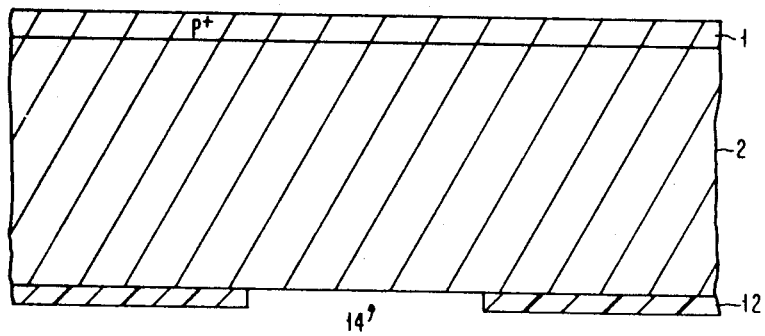
Figure 2C:
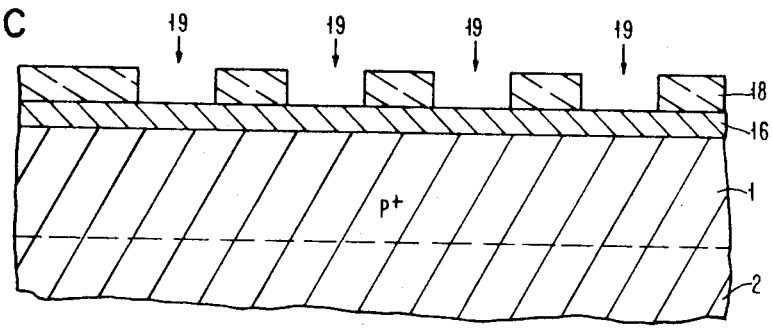

As shown in FIG. 2B by means of a photolithographic etching process, an opening or openings 14, respectively, is or are now made in oxide layer 12 on the lower side of the wafer. The lateral dimensions of opening or openings 14, respectively, are determined by the lateral dimensions of the tub-like recesses to be etched in a subsequent process step.

For a better illustration of the details which are of interest in the following process steps, FIGS. 2C–2H, unlike FIGS. 2A and 2B representing cross-sections through the entire thickness of the semiconductor wafer, depict larger sections of the upper side surface areas of the mask structure to be made. Onto the upper side of the wafer, an approximately 0.8 μm thick silicon dioxide layer 16 is now thermally grown, or preferably at a temperature of ≦600° C. by means of CVD, or by means of sputtering. On silicon dioxide layer 16, an approximately 0.5–1 μm thick layer 18 of a radiation-sensitive resist is applied by spin-on. Since a mask pattern of a very high resolution is to be generated, the radiation-sensitive resist has to be sensitive to electron beams, ion beams, or x-rays.

For example, by means of an electron beam pattern generator, resist layer 18 is now selectively irradiated in accordance with the desired mask pattern. The next step is a developing process, with a pattern remaining of resist layer 18 which precisely corresponds to the pattern which is to be etched in a subsequent process step into silicon layer 1, and whose openings are slightly larger than the desired mask pattern. With the best electron beam pattern generators commercially available today, it is possible, with a resist layer thickness between approximately 0.5 and approximately 1 μm, to transfer lines with a width of ≦1 μm with maximum precision into the resist layer. After developing, a structure as shown in a cross-section in FIG. 2C results.

Figure 2D:
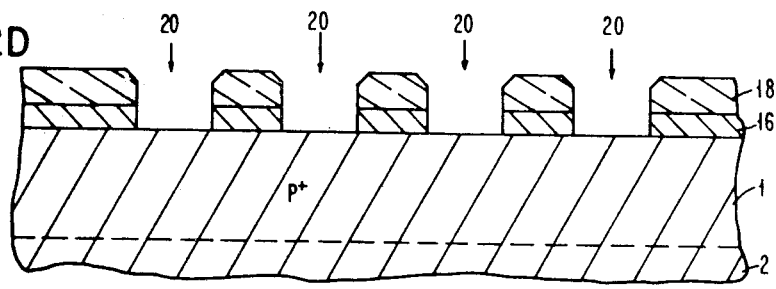

In the next process step, by means of reactive ion etching in an atmosphere containing CHF$_3$, or a CF$_4$/H$_2$ mixture, SiO$_2$ layer 16 is etched off using resist mask 18 selectively, i.e. in all those places where openings 19 are provided in resist layer 18. For reactive ion etching, a planar cathode system is used with a pressure of approximately 53 μbar. The RF power is at approximately 0.2 Watt/cm$^2$, and if CF$_4$ and H$_2$ are used, the flow rate ratio CF$_4$:H$_2$ is at approximately 3.5:1. The pattern formed in the resist layer can with a high scale precision then be etched into an SiO$_2$ layer which like the present one is relatively thick, if the pattern has line widths of $\leq 1$ μm. During reactive ion etching, resist layer 18 is slightly thinned. The openings in silicon dioxide layer 16 have walls which are vertical to the substrate surface and they are in precise alignment with the openings in resist layer 18. The thus obtained structure is depicted in FIG. 2D in a cross-section, where the openings etched into the resist and into the silicon dioxide are identified by reference number 20.

Figure 2E:
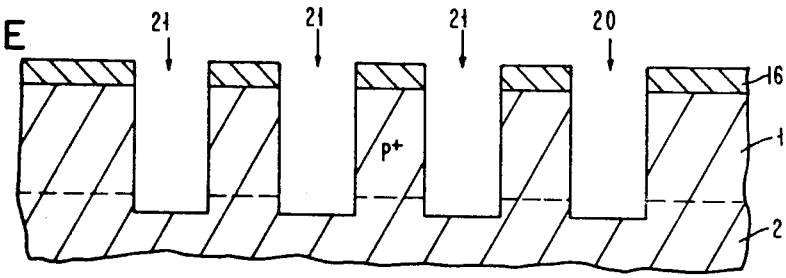

In the following process step shown in FIG. 2E, P$^+$-doped silicon layer 1 is selectively etched. A reactive ion etching method is used. The operation takes place in an atmosphere containing argon and chlorine. The structure in the approximately 0.8 μm thick SiO$_2$ layer 16 is used as an etching mask. The etching conditions can easily be chosen in such a manner that an etching speed ratio between SiO$_2$ and Si of 1:10 can be achieved. If the method is implemented with a planar cathode system at a pressure of approximately $1.33 \times 10^{-2}$ mbar in an atmosphere containing 97 vol.% argon and 3 vol.% chlorine, holes with walls vertical to the substrate surface are etched into the P$^+$-doped silicon layer 1. There is no overetching. During the etching of layer 1, SiO$_2$ layer 16 is also gradually removed (remaining SiO$_2$ residues can be removed through immersion in buffered hydrofluoric acid). After the etching of layer 1, the structure shown in a cross-section in FIG. 2E is obtained, where the holes in layer 1 are given the reference number 21. The depth into which the silicon is etched is uncritical as long as it is greater than the defined thickness of P$^+$-doped silicon layer 1.

After holes 21 have been made in layer 1, tub-like recesses 4 are etched back from the wafer, silicon dioxide layer 12 with openings 14 being used for an etching mask.

Figure 2F:
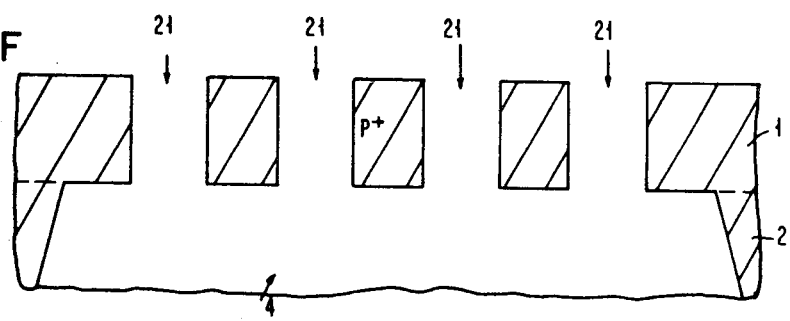

For etching, a solution consisting of ethylendiamine, pyrocatechol, water and, if necessary, hydrogenperoxide is used at a temperature of $\leq 118°$ C. A characteristic feature of this solution is that it etches anisotropically monocrystalline silicon which is N-doped or not P$^+$-doped, respectively (<100> planes are etched approximately 16 times faster than <111> planes) and that it etches P$^+$-doped silicon to a very small extent. The solution preferably consists of 22 g pyrocatechol, 630 ml ethylendiamine, 115 ml water, and 29 ml H$_2$O$_2$. Given the above-specified characteristics of the etching solution, etching of the tub-like recesses 4 is controlled very easily. More precisely, etching is determined by the conditions for the doping of layer 1, i.e. the etching process vertically to the wafer surface is practically stopped when the etching solution has removed all silicon with a boron concentration $<7 \times 10^{19}$ atoms/cm$^3$. This means that a silicon layer remains with a boron concentration $\geq 7 \times 10^{19}$ atoms/cm$^3$ and this is by definition layer 1. After the etching of tub-like recesses 4, the structure depicted in FIG. 2F is obtained.

Figure 2G:
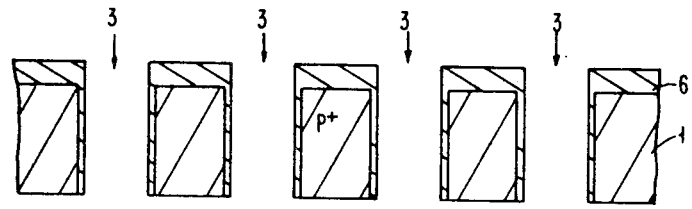

In the next process step, a gold layer is applied on the upper side of the mask, either by means of vapor deposition in the usual way, or through sputtering. In the sputtering apparatus, the mask is placed on a plate which is faced in parallel by a target plate made of gold or having a gold cover. The distance between the mask and the target plate is approximately 3 cm. Sputtering is implemented in an argon-containing atmosphere, at a pressure of approximately $1.33 \times 10^{-1}$ mbar. Depending on the ion energies to which the mask is to be exposed, and which are between approximately 50 and 200 keV, a gold layer is applied whose whickness is between approximately 0.2 and 0.6 μm. The gold is precipitated not only on the upper surface of layer 1, but also on the walls of holes 21. Under the given sputtering conditions, the thickness ratio of the gold layer applied on the surface of layer 1 to the thickness of the gold precipitated on the walls of holes 21 is approximately 3:1. The adhesion of the gold to the silicon is sufficient as long as the mask is not exposed to a wet process. The structure obtained after the application of gold layer 6 is shown in FIG. 2G in cross-section.

Figure 2H:
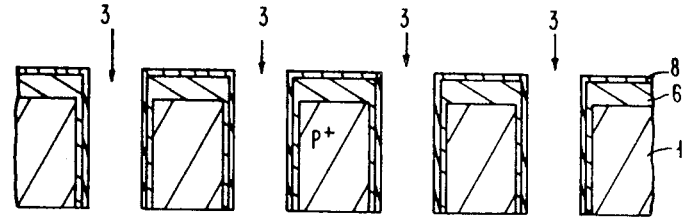

Finally, a carbon layer is applied on gold layer 6. The carbon layer is either vapor deposited out of an arc discharge using carbon electrodes, or it is applied by means of sputtering, with a target plate of carbon being used. Otherwise, the same process is executed as for the application of the gold layer. The carbon layer on the upper side of the mask will be in the order of 0.1 μm thick. This thickness is higher than necessary for the protection of the gold layer, but it insures that the gold at the walls of holes 21, or in the hole edge area is covered with a sufficiently thick carbon layer. The structure obtained after the application of carbon layer 8 is shown in FIG. 2H which represents a section of FIG. 1C.

The lateral dimensions of holes 3 in this structure correspond to the lateral dimensions of the desired mask pattern. The lateral dimensions of openings 19 in radiation sensitive layer 18 which have been made at the beginning of the manufacturing process are therefore dimensioned in accordance with the thickness of the gold and carbon layers precipitated at the walls of holes 21.

In making the embodiment shown in a cross-section in FIG. 1D, of the mask as disclosed by the invention, the above-described manufacturing process has to be modified only in that prior to the application of carbon layer 8 a gold layer is applied on the lower side of the silicon frame. The thickness of the mask on the lower side is not critical, but it will be preferably about as thick as the gold layer on the upper side. When this embodiment of the mask as disclosed by the invention is made, it should be considered when dimensioning the holes in the radiation-sensitive layers that the appllication of the gold layer on the lower side of the mask will further increase the thickness of the gold layer on the walls of holes 21.

In making the embodiment, shown in a cross-section in FIG. 1A, of the mask as disclosed by the invention, a tantalum coating is used on the structure of FIG. 2F, by a two-sided application of a tantalum layer. The tantalum is applied in a known manner by means of vapor deposition or sputtering. Depending on the energy of the ions to which the mask is to be exposed (the energy is between approximately 50 and approximately 200 keV), the tantalum layer on the upper side of the mask is between approximately 0.3 and approximately 0.8 μm thick. The layer on the lower side of the mask is approximately the same thickness, but for defining the precise thickness, it is necessary to make known tests, the full compensation of the thermally caused mechanical tension being the decisive criterion for the layer thickness on the lower side of the mask.

When tantalum layer 5 is applied on the upper and the lower side of the silicon frame, tantalum is also deposited on the walls of holes 21. The thickness of the tantalum layer can be made smaller on the hole walls than on the upper and lower side of the mask. Instead of a tantalum layer, it is also possible to apply a tungsten layer on both sides of the mask. The tungsten layer is between approximately 0.2 and 0.6 μm thick on the upper side of the mask. With respect to the thickness of the layer on the lower side and on the walls of holes 21, the same applies as for tantalum.

In making the embodiment, as shown in a cross-section in FIG. 1B, of the mask as disclosed by the invention, the same method as for the production of the mask embodiment shown in FIG. 1D is applied, with the exception of the last step. That is, instead of the one-side application of a carbon layer, a molybdenum layer 7 is applied on both sides. Molybdenum layer 7 is applied in two successive identical steps, by vapor deposition or sputtering. As molybdenum, like tantalum, tungsten, and titanium, is by a factor of 3 to 4 less resistant against ions than carbon, the molybdenum layer on the upper side of the mask is to be slightly thicker than the carbon layer, i.e. between approximately 0.2 and 0.3 μm thick. With regard to the thickness of the molybdenum layer on the lower side of the mask, and on the hole walls, there correspondingly applied what has been stated in connection with tantalum. For this embodiment of the mask as disclosed by the invention, it is possible to use instead of gold for layer 6 platinum, tungsten, tantalum, and, restrictedly, silver which however has a much lower absorption capacity than gold. Instead of molybdenum for layer 7, titanium, tungsten or tantalum may be used. The respective necessary thicknesses have to be ascertained through simple experiments known in the art, criteria for the correct thickness being the complete absorption of the ions in the coating of the upper side of the mask, high mechanical resistance against ions, complete compensation of the mechanical tensions, and to a certain degree the electrical and thermal conductivity.

In making an embodiment of the mask as desclosed by the invention, with a diffusion barrier as represented in a cross-section, e.g. in FIG. 1E, the above-described manufacturing process is followed until the structure of FIG. 2F is produced. Subsequently, prior to the application of the ion-absorbing layer, an $Si_3N_4$ layer 9 is made on one or two sides through PECVD using a mixture of ammonia and a silicon compound, as e.g. $SiH_4$, at temperatures of less than 600° C. Layer 9 will have a thickness of approximately 0.1–0.2 μm.

The masks as disclosed by the invention can be used in those cases where semiconductor regions are doped by means of ion implantation, or where structures are to be generated "photo"-lithographically in radiation-sensitive resists. Such resist structures are, for example, used in the production of microminiaturized circuits in semiconductor wafers, and as an etching mask and lift-off mask in the production of magnetic bubble components. With the masks as disclosed by the invention, patterns can be transferred into radiation-sensitive resist layers comprising pattern elements with a width <1 μm. Although such patterns can also be transferred with apparatus operating with a focussed beam whose diameter is smaller than the dimension of the smallest pattern element to be transferred, and which is guided under computer control over the substrate to be irradiated, these known apparatus do not permit such a high throughput as required for mass production. Apart from the advantage that they can transfer patterns with maximum precision, the masks as disclosed by the invention have the added advantage that they permit a high throughput because they can be irradiated with exceptionally high ion currents without an unacceptable distortion of the masks. High ion currents therefore do not have the consequence that the patterns to be transferred are distorted, but they permit a high throughput.

When the mask is used, its lower side faces the substrate to be irradiated. The distance between mask and substrate is in the order of ½ mm. The mask is aligned with the workpiece to be processed and coated with a radiation-sensitive resist, e.g. with a semiconductor wafer. Subsequently, the mask is scanned line-by-line with an ion beam having a preferred diameter of approximately 1 mm until each point of the mask has been in the beam path. Depending on the conductivity type to be produced, the mask is irradiated in ion implantation preferably with boron ions, phosphorous ions, and arsenic ions. In ion beam lithography, hydrogen ions, lithium ions, and arsenic ions are preferably used. In ion implantation, the preferred ion energy is between approximately 120 and 200 keV, and the dosage is in the order of $10^{15}$ ions/cm². In ion beam lithography, the preferred ion energy is between 50 and 200 keV, and the dosage is in the order of $10^{12}$ to $10^{13}$ ions/cm². For a 5×5 mm surface, which approximately corresponds to the size of a typical semiconductor chip, the irradiation period is usually between approximately 50 and approximately 200 milliseconds.

It is apparent that with the mask having through-going holes as disclosed by the invention, it is not possible to transfer annular or closed pattern elements. This problem can be solved by using two masks which comprise parts of the annular pattern elements supplementing each other in such a manner that if the resist layer is irradiated through both masks, the annular pattern element is latently formed. Details of this method, and of the masks used there are described in German Offenlegungsschrift No. 27 39 502.

If it has a sufficiently heat-conductive coating, the ion beam mask heats up to a maximum of approximately 150° C. At this temperature already there can be mechanical tensions which if they are not compensated can effect an intolerable deformation of the mask. The ions impacting with a high energy on the mask surface attack the mask material, and the amount of material they remove increases with the decreasing resistance of the material on the mask surface exposed to the ions. The material on the upper side of the mask is less exposed to the risk of such a removal than the material at the edges, i.e. at the place of the surface transition from the upper surface into the holes. This is due to the fact that with an increasing impact angle of the ions up to an angle of 60° the removal speed increases, and then decreases. Hence, if the removal at the edges has started at an impact angle other than zero, the removal speed strongly increases. The consequence is a rounding-off of the edges (forming of a phase). Such a removal and consequently the formation of round edges is prevented according to the invention in that the mask surface exposed to the ions comprises a material which is mechanically very resistant, as e.g. carbon.

What is claimed is:

1. A projection mask comprising; a thin $P^+$-doped silicon layer having through holes adapted to the mask pattern, a grid supporting said silicon layer in areas where holes are not present, said grid comprising silicon ribs doped differently from the silicon layer and having on at least an upper side facing away from the grid an ion-absorbing layer, said grid on at least the surface exposed to ion radiation being electrically and thermally conductive, said silicon layer and said grid defining a silicon frame, a coating disposed on said frame where it is to be exposed to the ion beams having at least such a thickness, taking into consideration the ion energy and the characteristics of the covering material, preventing ion penetration into the silicon, said mask surface exposed to the ion radiation comprising a material resistant to the ion attack, and said silicon frame coating not causing mask deformation due to temperature and/or inherent tensions of the coating.

2. A projection mask as claimed in claim 1, wherein the frame lower side with the grid is provided with a coating.

3. A projection mask as claimed in claim 2, wherein the coating on the lower side is substantially identical with the coating on the upper side.

4. A projection mask as claimed in claim 1, further comprising a diffusion barrier on one side of the P+-silicon layer for protection against penetrating ions and atoms of the ion-absorbing layer.

5. A projection mask as claimed in claim 4, wherein said ion-absorbing layer is a material selected from the group consisting of gold, silver, tungsten, platinum, and tantalum, and said ion-resistant material is selected from the group consisting of carbon, molybdenum, tungsten, tantalum, and titanium, and said material for the diffusion barrier is $Si_3N_4$.

6. A projection mask as claimed in claim 5, further comprising a layer of a material both absorbing and mechanically resistant applied on said silicon frame.

7. A projection mask as claimed in claim 6, wherein the layer applied on said silicon frame is selected from the group consisting of tantalum or tungsten.

8. A projection mask as claimed in claim 5, wherein on the silicon frame a layer of gold, and on the gold layer a layer of molybdenum are applied.

9. A projection mask as claimed in claim 5, wherein at least the silicon frame side facing ion irradiation is covered with a layer of gold, and a superimposed layer of carbon.

10. A projection mask as claimed in claim 9, wherein on the upper side of the frame said gold layer is in the range of approximately between 0.2 and approximately 0.6 μm thick, the carbon layer is in the order of 0.1 μm thick, and the thickness of the layers on the walls of the holes in the silicon layer is thinner approximately by a factor of 3 than the thickness of the layers on the upper side of the frame.

11. A projection mask as claimed in any one of claims 1, 2, 4, 5, 9 and 10, wherein the coating on the upper side of the frame and on the hole walls comprises a gold layer, a carbon layer and a diffusion barrier, and said gold layer and the diffusion barrier also extend over the lower side of the frame.

12. A projection mask as claimed in claims 1, 2 or 3, wherein said ion-absorbing layer is a material selected from the group consisting of gold, silver, tungsten, platinum, and tantalum and said ion-resistant material is selected from the group consisting of carbon, molybdenum, tungsten, tantalum and titanium.

13. A projection mask as claimed in claims 2 or 3, further comprising a diffusion barrier on one side of the P+-silicon layer for protection against penetrating ions and atoms of the ion-absorbing layer.

* * * * *